(12) United States Patent
Kondo (10) Patent No.: US 11,239,826 B2
(45) Date of Patent: Feb. 1, 2022

(54) FILTER DEVICE

(71) Applicant: Murata Manufacturing Co., Ltd., Nagaokakyo (JP)

(72) Inventor: Seima Kondo, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 0 days.

(21) Appl. No.: 17/015,744

(22) Filed: Sep. 9, 2020

(65) Prior Publication Data

US 2021/0119610 A1    Apr. 22, 2021

(30) Foreign Application Priority Data

Oct. 16, 2019   (JP) .............................. JP2019-189353

(51) Int. Cl.

| | |
|---|---|
| *H03H 9/54* | (2006.01) |
| *H03H 9/64* | (2006.01) |
| *H03H 9/56* | (2006.01) |
| *H03H 9/52* | (2006.01) |
| *H03H 9/70* | (2006.01) |
| *H03H 9/13* | (2006.01) |
| *H03H 9/205* | (2006.01) |

(Continued)

(52) U.S. Cl.
CPC ........ *H03H 9/542* (2013.01); *H03H 9/02559* (2013.01); *H03H 9/0557* (2013.01); *H03H 9/13* (2013.01); *H03H 9/205* (2013.01); *H03H 9/52* (2013.01); *H03H 9/568* (2013.01); *H03H 9/6483* (2013.01); *H03H 9/70* (2013.01)

(58) Field of Classification Search
CPC .. H03H 9/52; H03H 9/13; H03H 9/70; H03H 9/205; H03H 9/6483; H03H 9/725; H03H 9/542; H03H 9/568
USPC .......................... 333/133, 187, 188, 193–196
See application file for complete search history.

(56) References Cited

U.S. PATENT DOCUMENTS

| | | | |
|---|---|---|---|
| 2006/0139125 A1* | 6/2006 | Shiga-ken | H03H 9/605 333/193 |
| 2007/0111674 A1 | 5/2007 | Iwamoto et al. | |
| 2011/0043428 A1 | 2/2011 | Fujiwara et al. | |

(Continued)

FOREIGN PATENT DOCUMENTS

| | | |
|---|---|---|
| JP | 2007-142560 A | 6/2007 |
| WO | 2010/061559 A1 | 6/2010 |

(Continued)

*Primary Examiner* — Robert J Pascal
*Assistant Examiner* — Jorge L Salazar, Jr.
(74) *Attorney, Agent, or Firm* — Keating & Bennett, LLP (57) ABSTRACT

A filter device includes series and parallel arm resonators provided at a filter chip and inductors electrically connected in series with respective ones of the parallel arm resonators. A first inductor having the highest inductance of the inductors is electrically connected in series with a first parallel arm resonator having the highest anti-resonant frequency of the parallel arm resonators. One end of the first parallel arm resonator and one end of a second parallel arm resonator in other ones of the parallel arm resonators are electrically connected to a same wiring line in wiring lines separated by the series arm resonators on a line electrically connecting an input terminal and an output terminal of the filter chip. The other ends of the first and second parallel arm resonators are respectively electrically connected to first and second ground terminals of the filter chip.

20 Claims, 10 Drawing Sheets

(51) Int. Cl.
*H03H 9/05* (2006.01)
*H03H 9/02* (2006.01)

(56) References Cited

U.S. PATENT DOCUMENTS

2012/0293277 A1 11/2012 Hara et al.
2017/0272057 A1 9/2017 Takata

FOREIGN PATENT DOCUMENTS

WO 2011/096245 A1 8/2011
WO 2016/088680 A1 6/2016

\* cited by examiner

FILTER DEVICE

CROSS REFERENCE TO RELATED APPLICATIONS

This application claims the benefit of priority to Japanese Patent Application No. 2019-189353 filed on Oct. 16, 2019. The entire contents of this application are hereby incorporated herein by reference.

BACKGROUND OF THE INVENTION

1. Field of the Invention

The present invention relates to a filter device.

2. Description of the Related Art

In each of mobile communication devices, such as cellular phones, a common antenna is sometimes used for the transmission of a transmission signal and the reception of a reception signal for a smaller terminal. A duplexer for separating a transmission signal and a reception signal is connected to such an antenna. As an example of a duplexer, a ladder filter circuit is used which passes a signal in a predetermined frequency band and attenuates a signal in the other frequency band with a configuration in which a plurality of resonators having specific resonant frequencies and specific anti-resonant frequencies are connected in a ladder form.

For example, International Publication No. 2016/088680 discloses a ladder filter circuit including a series arm resonator, a parallel arm resonator, and an inductor connected in series with the parallel arm resonator.

It is generally desired that a ladder filter circuit have frequency characteristics in which the input loss in the pass band is low and the attenuation characteristics in the attenuation band near the pass band is steep. However, for example, if an inductor is connected in series with a parallel arm resonator, the anti-resonant frequency of the parallel arm resonator remains substantially intact and the resonant frequency of the parallel arm resonator is shifted to a lower-frequency side. Accordingly, the steepness of attenuation characteristics is lost in the attenuation band while the input loss in the pass band is reduced. On the other hand, for example, if many parallel arm resonators are added in a ladder filter circuit, the input loss in the pass band is increased while attenuation characteristics in the attenuation band are improved.

SUMMARY OF THE INVENTION

Preferred embodiments of the present invention to provide filter devices with each of which the input loss in the pass band is able to be significantly reduced while the steepness of attenuation characteristics in the attenuation band is maintained.

A filter device according to a preferred embodiment of the present invention includes a plurality of series arm resonators provided at a filter chip, a plurality of parallel arm resonators provided at the filter chip, and a plurality of inductors electrically connected in series with respective ones of the parallel arm resonators. A first inductor having a highest inductance of the inductors is electrically connected in series with a first parallel arm resonator having a highest anti-resonant frequency of the parallel arm resonators. One end of the first parallel arm resonator and one end of a second parallel arm resonator included in the other ones of the parallel arm resonators are electrically connected to a same wiring line included in a plurality of wiring lines separated by the series arm resonators on a line electrically connecting an input terminal and an output terminal of the filter chip. The other end of the first parallel arm resonator is electrically connected to a first ground terminal of the filter chip. The other end of the second parallel arm resonator is electrically connected to a second ground terminal of the filter chip which is different from the first ground terminal.

According to preferred embodiments of the present invention, filter devices are able to be provided with each of which the input loss in the pass band is able to be significantly reduced while the steepness of attenuation characteristics in the attenuation band is maintained.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Preferred embodiments of the present invention will be described in detail below with reference to the accompanying drawings. The same reference numerals represent the same or similar components or the same or similar portion to avoid repeated explanation.

Figure 1:
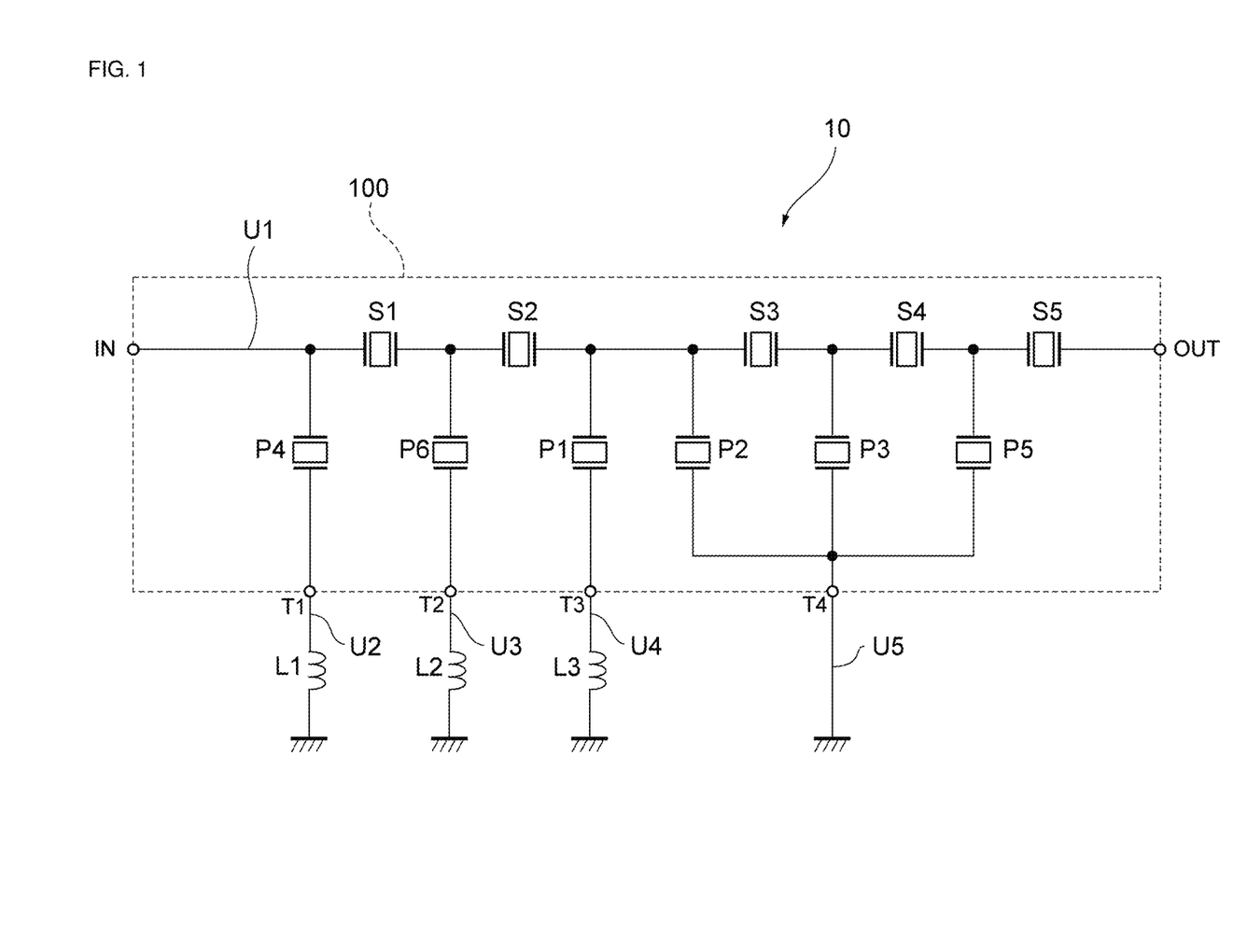
FIG. 1 is a diagram showing a circuit of a filter device according to a first preferred embodiment of the present invention.

FIG. 1 is a diagram showing a circuit of a filter device according to a first preferred embodiment of the present invention. In the case where a single antenna to transmit and receive a radio frequency (RF) signal is included in a mobile communication device, for example, a branching filter to separate a transmission signal and a reception signal is included. The filter device 10 may define a transmission signal filter circuit or a reception signal filter circuit in a branching filter. A branching filter may be, for example, a composite filter device that includes a plurality of filter circuits and separates signals in a plurality of frequency bands. Examples of a composite filter device include a duplexer that is a composite component of two filter circuits, a triplexer that is a composite component of three filter circuits, a quadplexer that is a composite component of four filter circuits, and an octoplexer that is a composite component of eight filter circuits.

As shown in FIG. 1, the filter device 10 according to the first preferred embodiment is a ladder filter in which a plurality of resonators are electrically connected in series and in parallel. The filter device 10 includes five series arm resonators S1 to S5, six parallel arm resonators P1 to P6, and three inductors L1 to L3. The series arm resonators S1 to S5 and the parallel arm resonators P1 to P6 are provided at a filter chip 100. At the filter chip 100, an input terminal IN, an output terminal OUT, and terminals T1 to T4 are further provided. The inductors L1 to L3 are provided at a pattern layer 200.

When the filter chip 100 is provided as a transmission signal filter circuit, a transmission signal is supplied from, for example, a front-end module including a power amplifier to the input terminal IN and a transmission signal filtered by, for example, an antenna is supplied from the output terminal OUT. When the filter device 10 is provided as a reception signal filter circuit, a reception signal is supplied from, for example, an antenna to the input terminal IN and a reception signal filtered by, for example, a front-end module is supplied from the output terminal OUT.

Each of the terminals T1 to T4 is a ground terminal electrically connected to a parallel arm resonator. The terminal T3 is an example of a first ground terminal. The terminal T4 is an example of a second ground terminal.

On a line U1 electrically connecting the input terminal IN and the output terminal OUT, the five series arm resonators S1 to S5 are electrically connected in series in order of increasing distance from the input terminal IN. The six parallel arm resonators P1 to P6 are electrically connected in parallel and branch off from a plurality of wiring lines separated by the series arm resonators S1 to S5 on the line U1.

The parallel arm resonator P4 is an example of a fourth parallel arm resonator. One end of the parallel arm resonator P4 is electrically connected to a wiring line between the input terminal IN and the series arm resonator S1 and the other end of it is electrically connected to one end of the inductor L1 via the terminal T1. The other end of the inductor L1 is electrically connected to the ground. One end of the parallel arm resonator P6 is electrically connected to a wiring line between the series arm resonators S1 and S2 and the other end of it is electrically connected to one end of the inductor L2 via the terminal T2. The other end of the inductor L2 is electrically connected to the ground. The parallel arm resonator P1 is an example of a first parallel arm resonator. One end of the parallel arm resonator P1 is electrically connected to a wiring line between the series arm resonators S2 and S3 and the other end of it is electrically connected to one end of the inductor L3 via the terminal T3. The other end of the inductor L3 is electrically connected to the ground.

The parallel arm resonator P2 is an example of a second parallel arm resonator. One end of the parallel arm resonator P2 is electrically connected to the wiring line between the series arm resonators S2 and S3 and the other end of it is electrically connected to the ground via the terminal T4. The parallel arm resonator P3 is an example of a third parallel arm resonator. One end of the parallel arm resonator P3 is electrically connected to a wiring line between the series arm resonators S3 and S4 and the other end of it is electrically connected to the ground via the terminal T4. The parallel arm resonator P5 is an example of a fifth parallel arm resonator. One end of the parallel arm resonator P5 is electrically connected to a wiring line between the series arm resonators S4 and S5 and the other end of it is electrically connected to the ground via the terminal T4. As described above, the terminal T4 is shared by the parallel arm resonators P2, P3, and P5.

The anti-resonant frequency of the parallel arm resonator P1 is the highest of the anti-resonant frequencies of the parallel arm resonators P1 to P6 in the filter device 10. The inductance of the inductor L3 is the highest of the inductances of the inductors L1 to L3 electrically connected in series with the respective parallel arm resonators in the filter device 10. The anti-resonant frequency of the parallel arm resonator P2 is the highest of the anti-resonant frequencies of the parallel arm resonators P2, P3, and P5 in the filter device 10 which are not electrically connected in series with inductors.

For example, the anti-resonant frequency of each of the parallel arm resonators P3 and P5 in the filter device, which is not electrically connected in series with an inductor, is preferably higher than a predetermined percentage (e.g., about 99.5%, about 99.0%, about 98.5%, about 98.0%, about 95.0%, about 90.0%, about 85.0%, or about 80.0%) of the anti-resonant frequency of the parallel arm resonator P2. That is, the pitch of an interdigital electrodes transducer (IDT) of the parallel arm resonator P2 is preferably larger than the predetermined percentage of the pitch of an IDT of each of the parallel arm resonators P3 and P5, for example.

Figure 2:
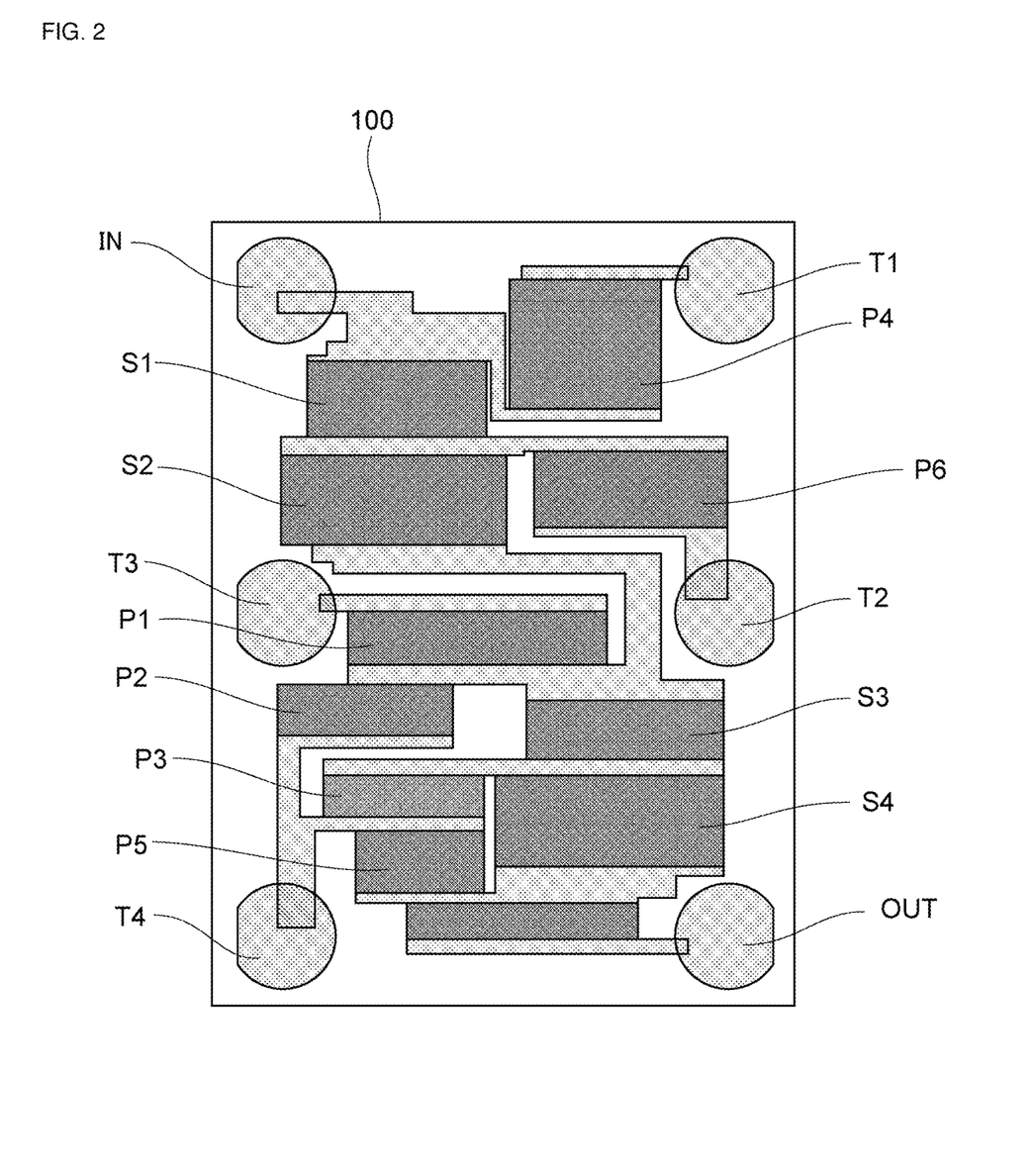
FIG. 2 is a plan view of a filter chip.

Next, the layout of a filter chip 100 will be described with reference to FIG. 2. FIG. 2 is a plan view of the filter chip 100 in the filter device 10 according to the first preferred embodiment. In FIG. 2, for convenience of explanation, the layout of the terminals IN, OUT, and T1 to T4, a wiring line pattern, the series arm resonators S1 to S5, and the parallel arm resonators P1 to P6 may be transparently shown.

As shown in FIG. 2, at the filter chip 100, the input terminal IN, the output terminal OUT, and the ground terminals T1 to T4, which have been described above, are provided and the wiring line pattern is provided to electrically connect these respective terminals. The filter chip 100 may include, for example, LiTaO$_3$. At predetermined respective positions in the wiring line pattern, the series arm resonators S1 to S5 and the parallel arm resonators P1 to P6 are provided.

Each of the series arm resonators S1 to S5 and the parallel arm resonators P1 to P6 may be, for example, a surface acoustic wave (SAW) element, a piezoelectric thin film resonator, or a bulk acoustic wave (BAW) element. For example, a resonant frequency fr of a SAW filter is represented by fr=v/λ [Hz] where λ represents the pitch of an IDT and v represents an acoustic velocity at a piezoelectric substrate in the SAW filter. Accordingly, the predetermined resonant frequency fr is able to be provided by adjusting, for example, the pitch of an IDT.

Next, a pattern layer 200 will be described with reference to FIGS. 3A to 3F. The filter device 10 includes the pattern layer 200 on which the filter chip 100 is laminated. The pattern layer 200 may include a conductive line pattern, a via, and the like provided at a substrate including an insulating material, for example, ceramic. At the pattern layer 200, for example, the inductors L1 to L3 are provided in a wiring line pattern.

Figure 3A:
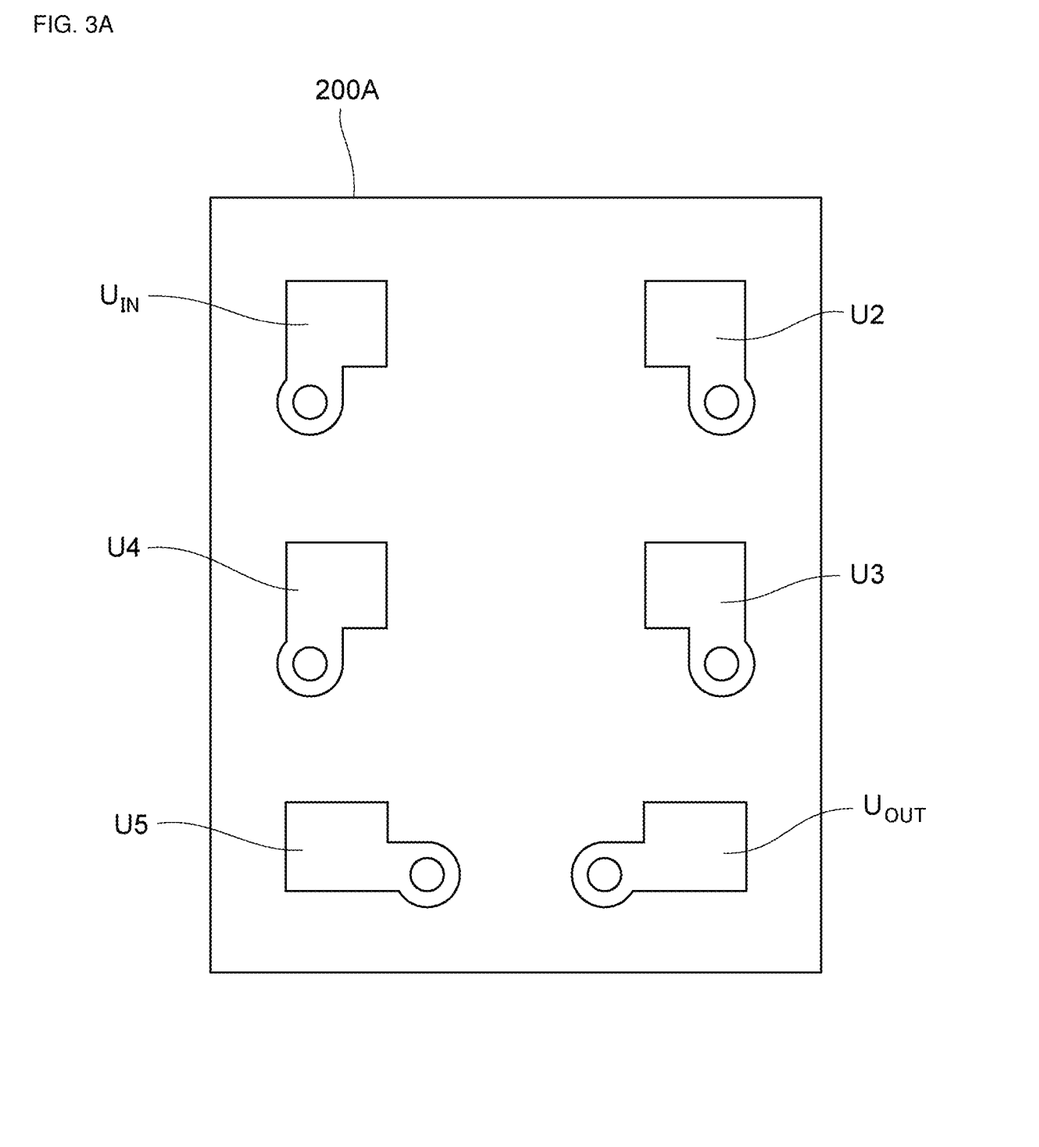
FIG. 3A is a plan view of a first layer in a pattern layer.
Figure 3B:
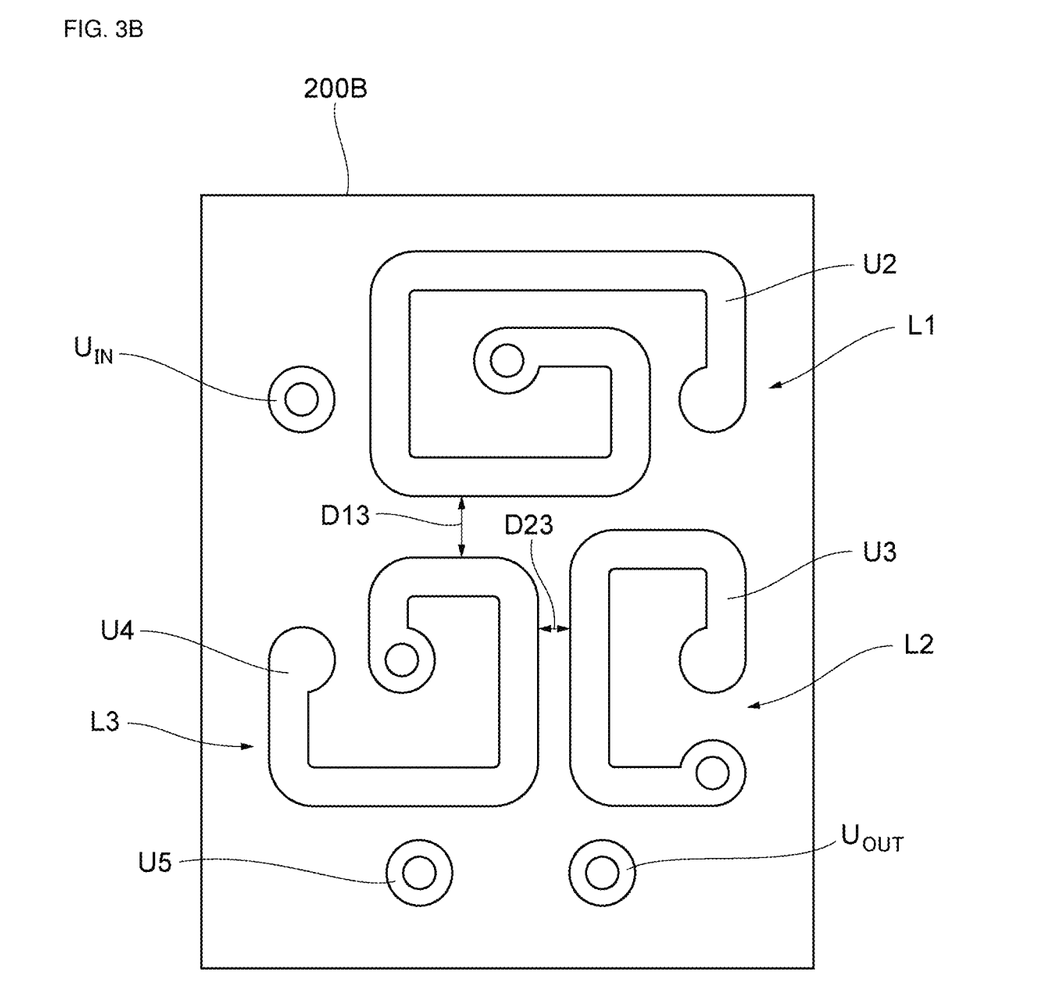
FIG. 3B is a plan view of a second layer in the pattern layer.
Figure 3C:
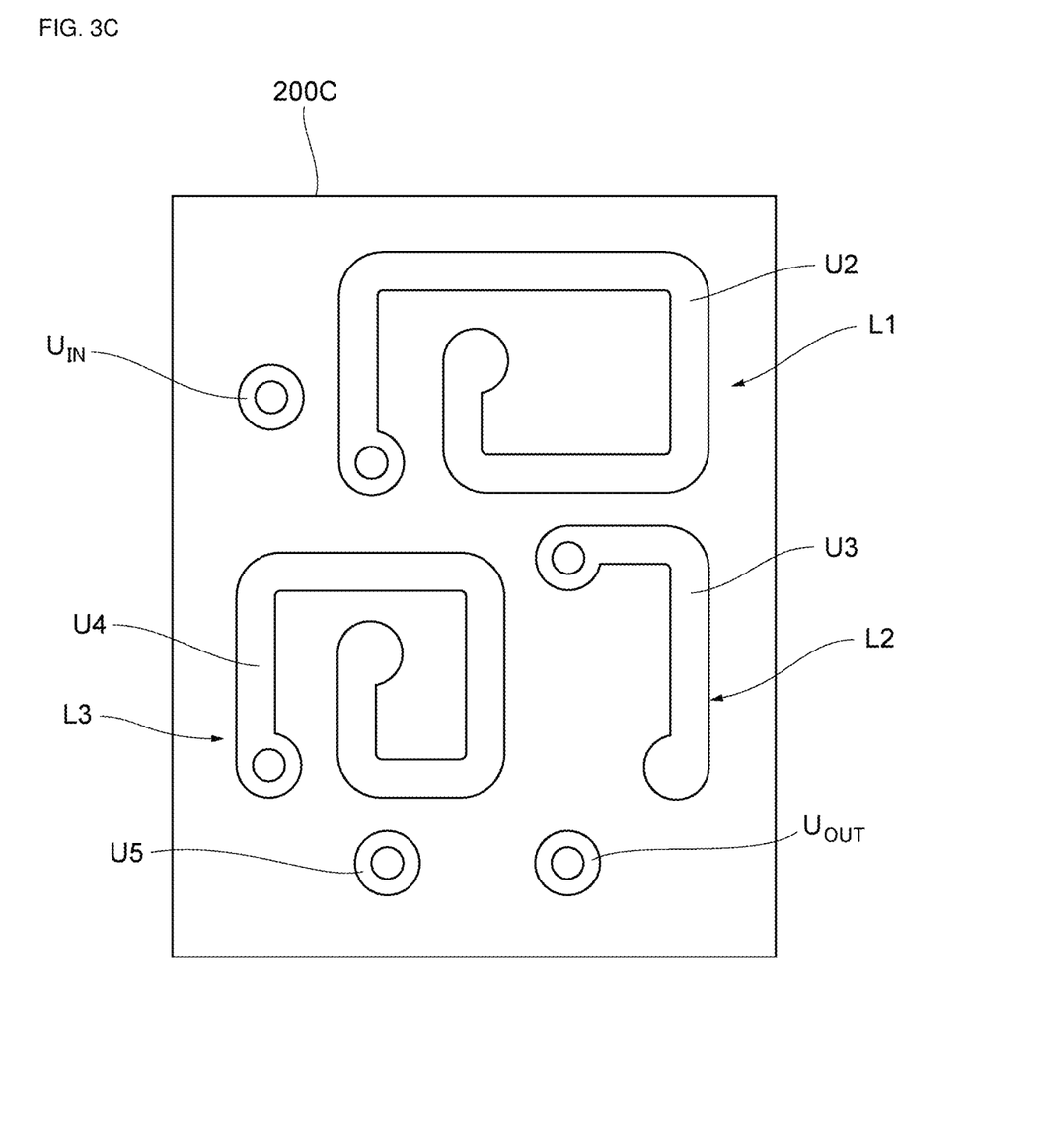
FIG. 3C is a plan view of a third layer in the pattern layer.
Figure 3D:
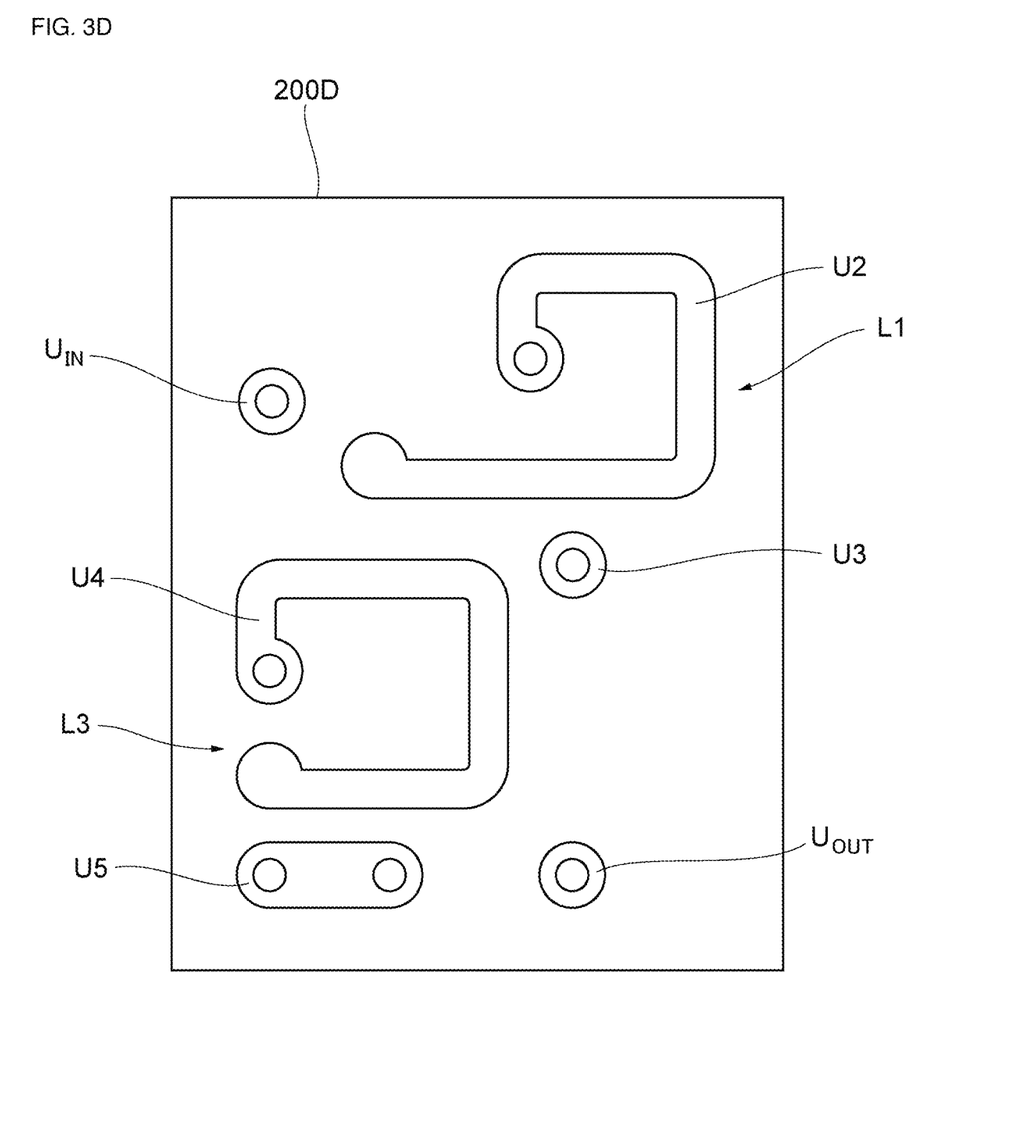
FIG. 3D is a plan view of a fourth layer in the pattern layer.
Figure 3E:
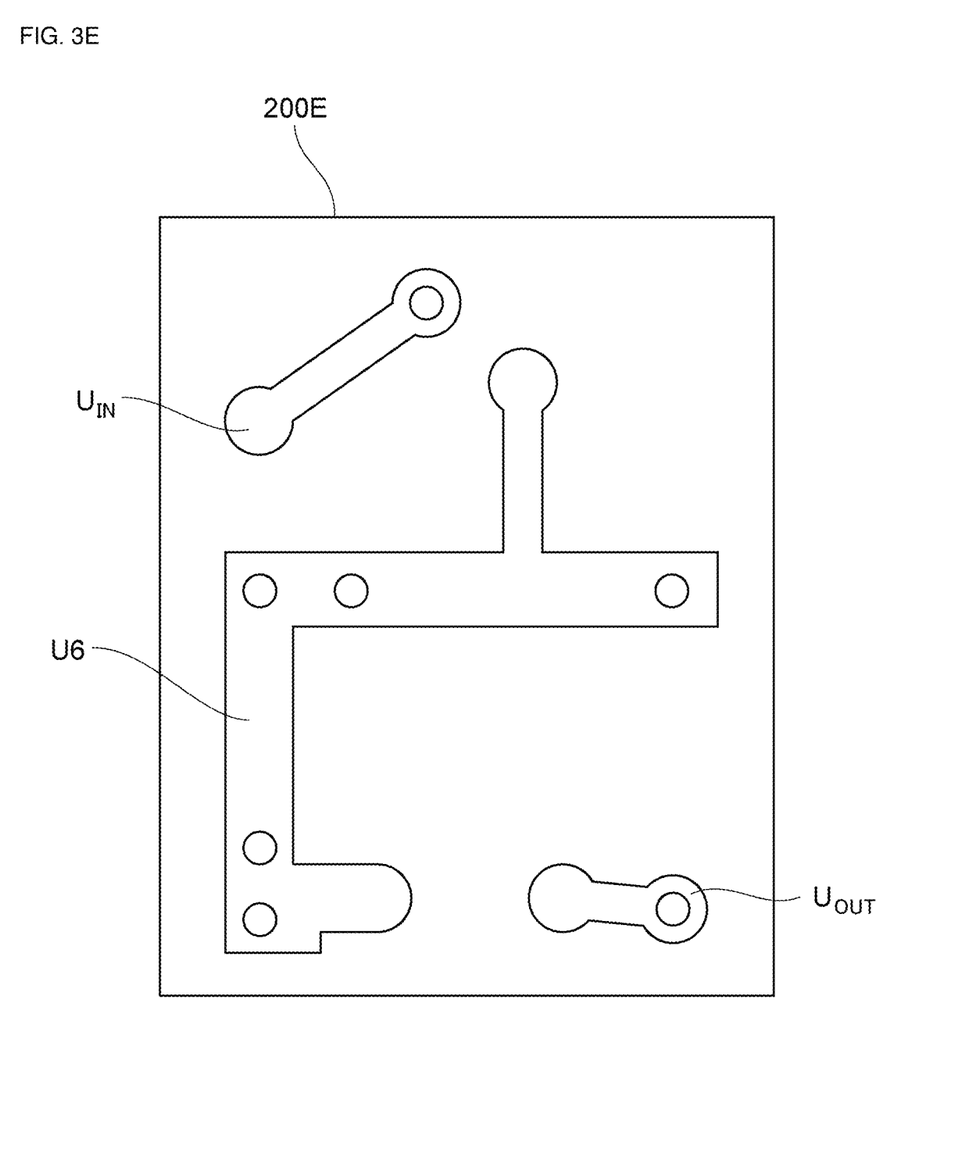
FIG. 3E is a plan view of a fifth layer in the pattern layer.
Figure 3F:
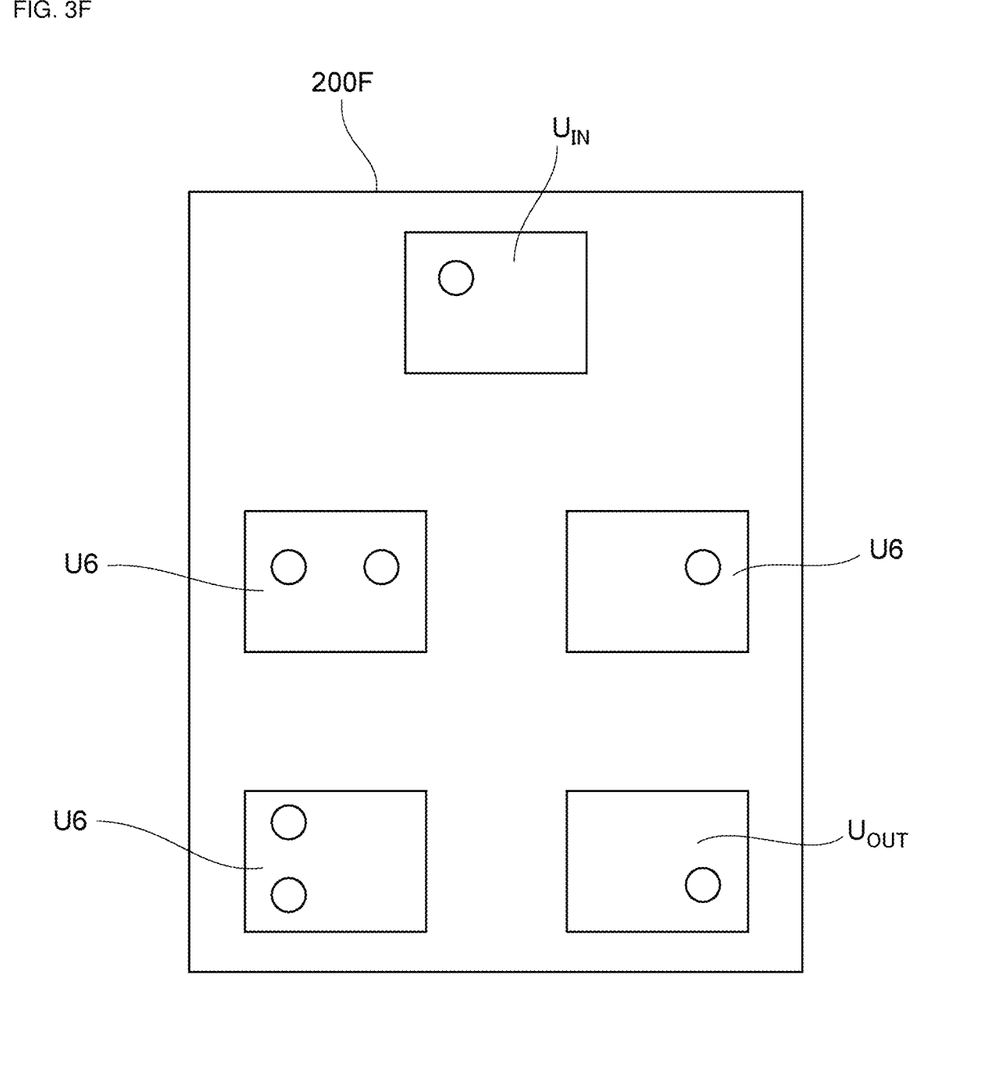
FIG. 3F is a plan view of a sixth layer in the pattern layer.

The pattern layer 200 includes a first layer 200A shown in FIG. 3A, a second layer 200B shown in FIG. 3B, a third layer 200C shown in FIG. 3C, a fourth layer 200D shown in FIG. 3D, a fifth layer 200E shown in FIG. 3E, and a sixth layer 200F shown in FIG. 3F that are laminated in this order.

The input terminal IN provided at the filter chip 100 is electrically connected to a wiring line pattern $U_{IN}$ provided at the first layer 200A to the sixth layer 200F. The output terminal OUT provided at the filter chip 100 is electrically connected to a wiring line pattern $U_{OUT}$ provided at the first layer 200A to the sixth layer 200F.

The terminal T1 provided at the filter chip 100 is electrically connected to a wiring line pattern U2 provided at the first layer 200A to the fourth layer 200D. The wiring line pattern U2 is wound in a spiral shape in the first layer 200A to the fourth layer 200D to define the inductor L1.

The terminal T2 provided at the filter chip 100 is electrically connected to a wiring line pattern U3 provided at the first layer 200A to the fourth layer 200D. The wiring line pattern U3 is wound in a spiral shape in the first layer 200A to the fourth layer 200D to define the inductor L2.

The terminal T3 provided at the filter chip 100 is electrically connected to a wiring line pattern U4 provided at the first layer 200A to the fourth layer 200D. The wiring line pattern U4 is wound in a spiral shape in the first layer 200A to the fourth layer 200D to define the inductor L3.

The wiring line patterns U2, U3, and U4 are integrated at the fifth layer 200E as a wiring line pattern U6. The wiring line pattern U6 at the fifth layer 200E is electrically connected to three terminals provided at the sixth layer 200F.

As described above, the terminal T4 provided at the filter chip 100 is electrically connected to the parallel arm resonators P2, P3, and P5 at the filter chip 100. The terminal T4 is electrically connected to a wiring line pattern U5 provided at the first layer 200A to the fourth layer 200D. The wiring line pattern U5 at the fourth layer 200D is electrically connected to the wiring line pattern U6 at the fifth layer 200E.

As shown in FIG. 3B, a distance D23 between the inductors L2 and L3 is smaller than a distance D13 between the inductors L1 and L3 in the filter device 10 according to the first preferred embodiment. The degree of magnetic coupling between the inductors L1 and L3 is lower than that between the inductors L2 and L3. Thus, the larger the distance between the wiring line on the line U1 electrically connecting the input terminal IN and the output terminal OUT to which an inductor other than the inductor L3 (the inductor L1 or L2) in the filter device 10 and the wiring line to which the inductor L3 is electrically connected, the lower the degree of magnetic coupling between the inductor and the inductor L3. Accordingly, in the filter device 10, the order of proximity of inductors in a circuit corresponds to the order of the degree of magnetic coupling between inductors. In consideration of it, the frequency characteristics of the filter device 10 to be described below are significantly improved.

Figure 4A:
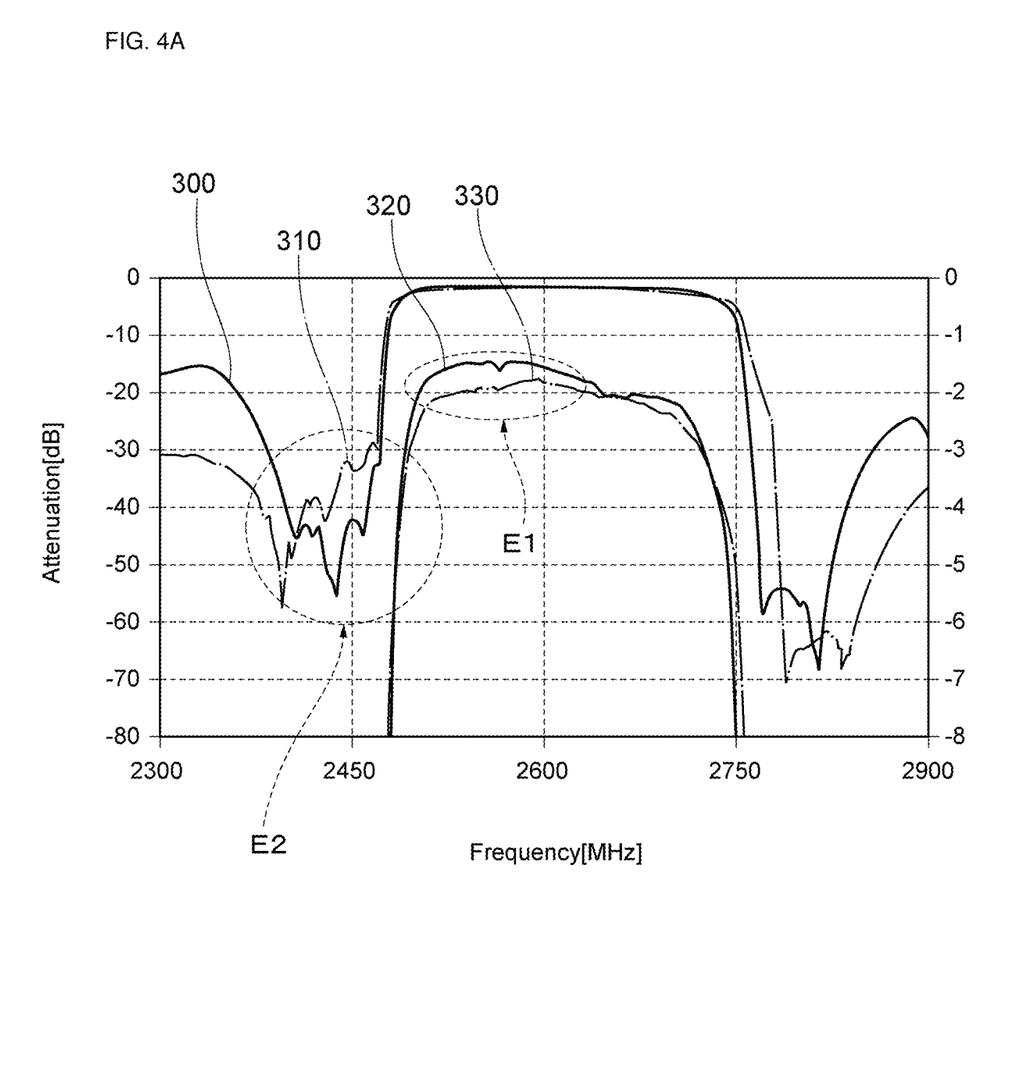
FIG. 4A is a graph representing simulation results of frequency characteristics (attenuation characteristics) of a filter device according to the first preferred embodiment of the present invention and a filter device that is a comparative example.
Figure 4B:
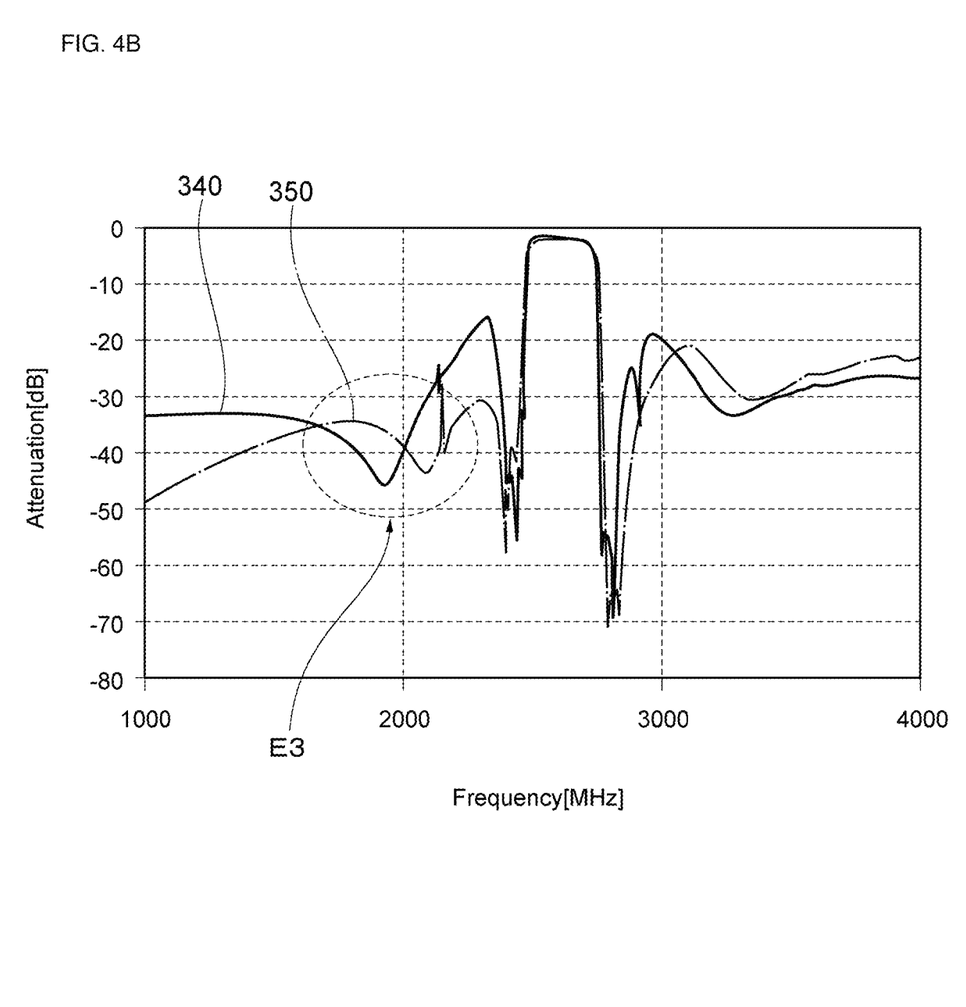
FIG. 4B is another graph representing simulation results of frequency characteristics (attenuation characteristics) of a filter device according to the first preferred embodiment of the present invention and a filter device that is a comparative example.

Next, the frequency characteristics of the filter device 10 according to the first preferred embodiment will be described with reference to FIGS. 4A and 4B. FIGS. 4A and 4B are graphs representing simulation results of frequency characteristics (attenuation characteristics) of the filter device 10 according to the first preferred embodiment and a filter device that is a comparative example. In a filter device that is a comparative example, the parallel arm resonator P1, which has the highest anti-resonant frequency of the parallel arm resonators P1 to P6, and the inductor L3, which has the highest inductance of the inductors L1 to L3, are not connected in series and the parallel arm resonators P1 and P2 are not connected to the same wiring line on the line U1.

In this example, Band41 specified by the 3GPP standard is shown. In the graphs shown in FIGS. 4A and 4B, the horizontal axis represents signal frequency (MHz) and the vertical axis represents signal insertion loss (S21) (dB).

Referring to FIG. 4A, the graphs show frequency characteristics 300 and 310 of the first preferred embodiment and the comparative example in units of 10 dB (scales of the vertical axis on the left side) and frequency characteristics 320 and 330 of the first preferred embodiment and the comparative example in units of 1 dB (scales of the vertical axis on the right side). Referring to FIG. 4B, the graphs show frequency characteristics 340 and 350 of the first preferred embodiment and the comparative example.

As represented by a reference numeral E1 in FIG. 4A, the input loss in the pass band is significantly reduced in the frequency characteristics of the filter device 10 according to the first preferred embodiment as compared with that in the frequency characteristics of a filter device that is a comparative example. As represented by a reference numeral E2 in FIG. 4A, the steepness of attenuation characteristics in the attenuation band on the lower-frequency side of the pass band are significantly improved in the frequency characteristics of the filter device 10 according to the first preferred embodiment as compared with that in the frequency characteristics of a filter device that is a comparative example.

In the filter device 10 according to the first preferred embodiment, the inductors L1, L2, and L3 are electrically connected in series with the parallel arm resonators P4, P6, and P1, respectively. Accordingly, the anti-resonant frequencies of the parallel arm resonators P4, P6, and P1 remain substantially intact and the resonant frequencies of them are shifted to a lower-frequency side. Thus, the inductive nature of the inductor included reduces the capacitive nature of the corresponding resonator in the frequency characteristics of the parallel arm resonators P4, P6, and P1 and a mismatch loss is significantly improved. As a result, the input loss in the pass band is significantly reduced in the frequency characteristics of the filter device 10 as represented by the reference numeral E1. As described above, the parallel arm resonator P1 has the highest anti-resonant frequency of the parallel arm resonators P1 to P6 in the filter device 10 and the inductor L3 has the highest inductance of the inductors L1 to L3 electrically connected in series with these respective parallel arm resonators. Accordingly, the series connection between the parallel arm resonator P1 and the inductor L3 most significantly contributes to the advantageous effect of the reduction in the input loss in the pass band of the series connections between a parallel arm resonator and an inductor.

Each of the filter device 10 according to the first preferred embodiment and a filter device that is a comparative example includes the parallel arm resonators P2, P3, and P5 not connected in series with respective inductors. The parallel arm resonators P2, P3, and P5 contribute to the steepness of attenuation characteristics in the attenuation band near the lower-frequency side of the pass band. In the filter device 10 according to the first preferred embodiment, the parallel arm resonator P2 and the parallel arm resonator P1 (the first parallel arm resonator) are electrically connected to the same wiring line on the line U1 as described above. As a result, the steepness of attenuation characteristics in the attenuation band is more easily maintained. As represented by the numeral reference E2 in FIG. 4A, in the filter device 10 according to the first preferred embodiment, the steepness of attenuation characteristics in the attenuation band near the lower-frequency side of the pass band is significantly improved as compared with a filter device that is a comparative example.

In the filter device 10 according to the first preferred embodiment, the other end of the parallel arm resonator P1 is electrically connected to the terminal T3 (the first ground terminal) and the other end of the parallel arm resonator P2 is electrically connected to the terminal T4 (the second ground terminal) that is different from the terminal T3. The other ends of the parallel arm resonators P1 and P2 are therefore electrically connected to the ground at positions outside the filter chip 100 which are comparatively far from each other in the circuit (the fifth layer 200E in the pattern layer 200 in this example). Accordingly, the effect of the electrical connection to the ground on the characteristics of the parallel arm resonators P1 and P2 is significantly reduced.

As represented by the numeral reference E3 in FIG. 4B, in the frequency characteristics of the filter device 10 according to the first preferred embodiment, an attenuation pole on the lower-frequency side of the pass band is shifted further downward in frequency (near about 1900 to about 2000 MHz, for example) as compared with the frequency characteristics of a filter device that is a comparative example. This attenuation pole is defined by the inductor L3 in the filter device 10 according to the first preferred embodiment.

A preferred embodiment of the present invention has been described above. A filter device according to a preferred embodiment of the present invention includes a plurality of series arm resonators provided at a filter chip, a plurality of parallel arm resonators provided at the filter chip, and a plurality of inductors electrically connected in series with respective ones of the parallel arm resonators. A first inductor having the highest inductance of the inductors is electrically connected in series with a first parallel arm resonator having the highest anti-resonant frequency of the parallel arm resonators. One end of the first parallel arm resonator and one end of a second parallel arm resonator included in the other ones of the parallel arm resonators are electrically connected to the same wiring line included in a plurality of wiring lines separated by the series arm resonators on a line electrically connecting an input terminal and an output terminal of the filter chip. The other end of the first parallel arm resonator is electrically connected to a first ground terminal of the filter chip. The other end of the second parallel arm resonator is electrically connected to a second ground terminal of the filter chip which is different from the first ground terminal.

Accordingly, the input loss in the pass band is able to be significantly reduced while the steepness of attenuation characteristics in the attenuation band is maintained in the filter device.

In the above-described filter device, one end of a third parallel arm resonator included in the other ones of the parallel arm resonators may be electrically connected to one of the wiring lines which is different from the wiring line to which the one end of the first parallel arm resonator and the one end of the second parallel arm resonator are electrically connected and the other end of the third parallel arm resonator may be electrically connected to the second ground terminal of the filter chip.

Accordingly, the steepness of attenuation characteristics in the attenuation band near the lower-frequency side of the pass band is significantly improved.

In the above-described filter device, the parallel arm resonators may include a fourth parallel arm resonator electrically connected to one of the wiring lines which is nearest to the input terminal and a fifth parallel arm resonator electrically connected to one of the wiring lines which is nearest to the output terminal.

Accordingly, the series connection between the first parallel arm resonator and the first inductor is electrically connected to the wiring line that is relatively centrally located on the line electrically connecting the input terminal and the output terminal. Accordingly, the above-described effect of significantly reducing the input loss in the pass band while maintaining the steepness of attenuation characteristics in the attenuation band is significantly improved.

In the above-described filter device, the second parallel arm resonator may have the highest anti-resonant frequency of the other ones of the parallel arm resonators.

Accordingly, the steepness of attenuation characteristics in the attenuation band near the lower-frequency side of the pass band is significantly improved.

In the above-described filter device, respective anti-resonant frequencies of the other ones of the parallel arm resonators excluding the second parallel arm resonator may preferably be, for example, higher than about 99.5% of the anti-resonant frequency of the second parallel arm resonator.

Accordingly, the steepness of attenuation characteristics in the attenuation band near the lower-frequency side of the pass band is significantly improved.

In the above-described filter device, a pitch of the second parallel arm resonator may preferably be, for example, larger than about 99.5% of respective pitches of the other ones of the parallel arm resonators excluding the second parallel arm resonator.

Accordingly, the steepness of attenuation characteristics in the attenuation band near the lower-frequency side of the pass band is significantly improved.

In the above-described filter device, the filter chip may preferably include, for example, LiTaO$_3$.

Accordingly, the frequency characteristics of the filter device are significantly improved.

In the above-described filter device, the inductors may be provided at a pattern layer on which the filter chip is laminated.

Accordingly, the frequency characteristics of the filter device are significantly improved and the filter device is able to be easily manufactured.

In the above-described filter device, one end of a second inductor included in the inductors may be electrically connected to the other end of one of the parallel arm resonators one end of which is electrically connected to a first wiring line included in the wiring lines which is different from the wiring line to which the first parallel arm resonator is electrically connected. One end of a third inductor included in the inductors may be electrically connected to the other end of one of the parallel arm resonators one end of which is electrically connected to a second wiring line included in the wiring lines which is farther from the wiring line to which the first parallel arm resonator is electrically connected than the first wiring line. A distance between the first inductor and the second inductor may be smaller than a distance between the first inductor and the third inductor.

In the filter device described above, the order of proximity of inductors in a circuit corresponds to the order of the degree of magnetic coupling between inductors. In consideration of it, the frequency characteristics of the filter device are significantly improved.

The above-described filter device may define a portion of a duplexer or multiplexer, for example.

Accordingly, a branching filter having significantly improved frequency characteristics is able to be provided.

The preferred embodiments described above are intended to help easily understand the present invention and do not limit the scope of the present invention. The present invention may be modified or improved without departing from the gist thereof, and equivalents of such modifications or improvements are also included in the present invention. That is, the preferred embodiment may be modified in design by those skilled in the art, and such modifications also fall within the scope of the present invention so long as the modifications include the features of the present invention. For example, elements included in the preferred embodiments and the arrangements, materials, conditions, shapes, sizes, and so on thereof are not limited to those shown but may be modified. Elements included in the preferred embodiments may be combined as much as technically possible, and such combinations of elements also fall within the scope of the present invention so long as the combinations of elements include the features of the present invention.

While preferred embodiments of the invention have been described above, it is to be understood that variations and modifications will be apparent to those skilled in the art without departing from the scope and spirit of the invention. The scope of the invention, therefore, is to be determined solely by the following claims.

What is claimed is:

1. A filter device comprising:
    a plurality of series arm resonators provided at a filter chip;
    a plurality of parallel arm resonators provided at the filter chip; and
    a plurality of inductors electrically connected in series with a first group of the plurality of parallel arm resonators; wherein
    a first inductor of the plurality of inductors that has a highest inductance of all of the plurality of inductors is electrically connected in series with a first parallel arm resonator of the plurality of parallel arm resonators that has a highest anti-resonant frequency of all of the plurality of parallel arm resonators;
    one end of the first parallel arm resonator and one end of a second parallel arm resonator included in a second group of the plurality of parallel arm resonators are electrically connected to a same wiring line included in a plurality of wiring lines separated by the series arm resonators on a line electrically connecting an input terminal and an output terminal of the filter chip;
    another end of the first parallel arm resonator is electrically connected to a first ground terminal of the filter chip; and
    another end of the second parallel arm resonator is electrically connected to a second ground terminal of the filter chip which is different from the first ground terminal.

2. The filter device according to claim 1, wherein
    the second group of the plurality of parallel arm resonators includes a third parallel arm resonator;
    one end of the third parallel arm resonator is electrically connected to one of the plurality of wiring lines which is different from the wiring line to which the one end of the first parallel arm resonator and the one end of the second parallel arm resonator are electrically connected; and
    another end of the third parallel arm resonator is electrically connected to the second ground terminal of the filter chip.

3. The filter device according to claim 2, wherein the second parallel arm resonator has a highest anti-resonant frequency of the second group of the plurality of parallel arm resonators.

4. The filter device according to claim 1, wherein the second parallel arm resonator has a highest anti-resonant frequency of the second group of the plurality of parallel arm resonators.

5. The filter device according to claim 4, wherein respective anti-resonant frequencies of the second group of the plurality of parallel arm resonators excluding the second parallel arm resonator are higher than about 99.5% of the anti-resonant frequency of the second parallel arm resonator.

6. The filter device according to claim 5, wherein a pitch of the second parallel arm resonator is larger than about 99.5% of respective pitches of the second group of the plurality of parallel arm resonators excluding the second parallel arm resonator.

7. The filter device according to claim 6, wherein the pitch of each of the plurality of parallel arm resonators is defined by a pitch of an interdigital electrodes transducer (IDT) included in each of the plurality of parallel arm resonators.

8. The filter device according to claim 1, wherein the plurality of inductors are provided at a pattern layer on which the filter chip is laminated.

9. The filter device according to claim 1, wherein
    one end of a second inductor included in the plurality of inductors is electrically connected to another end of one of the plurality of parallel arm resonators, one end of which is electrically connected to a first wiring line included in the plurality of wiring lines which is different from the wiring line to which the first parallel arm resonator is electrically connected;
    one end of a third inductor included in the plurality of inductors is electrically connected to another end of one of the parallel arm resonators, one end of which is electrically connected to a second wiring line included in the plurality of wiring lines which is farther from the wiring line to which the first parallel arm resonator is electrically connected than the first wiring line; and
    a distance between the first inductor and the second inductor is smaller than a distance between the first inductor and the third inductor.

10. A duplexer or multiplexer comprising the filter device according to claim 1.

11. A communication device, comprising:
    an antenna port; and
    a branching filter that separate a transmission signal provided to the antenna from a reception signal received by the antenna; wherein
    the branching filter includes a transmission signal filter and a reception signal filter; and
    at least one of the transmission signal filter or the reception signal filter is the filter device according to claim 1.

12. The communication device according to claim 11, wherein the branching filter separates signals in a plurality of frequency bands.

13. The filter device according to claim 1, wherein
    the plurality of series arm resonators includes a first series arm resonator electrically connected in series with a second series arm resonator by one of the plurality of wiring lines;
    the plurality of parallel arm resonators include a sixth parallel arm resonator;

one end of the sixth parallel arm resonator is electrically connected to the wiring line that electrically connects the first series arm resonator and the second series arm resonator; and another end of the sixth parallel arm resonator is electrically connected to a second inductor of the plurality of inductors.

14. The filter device according to claim 1, wherein the plurality of series arm resonators are electrically connected in series between the input terminal and the output terminal.

15. The filter device according to claim 1, wherein the plurality of parallel arm resonators include a fourth parallel arm resonator electrically connected to one of the plurality of wiring lines which is nearest to the input terminal and a fifth parallel arm resonator electrically connected to one of the wiring lines which is nearest to the output terminal.

16. The filter device according to claim 1, wherein each of the plurality of series arm resonators and each of the plurality of the parallel arm resonators are a surface acoustic wave (SAW) element, a piezoelectric thin film resonator, or a bulk acoustic wave (BAW) element.

17. The filter device according to claim 1, wherein the plurality of series arm resonators, the plurality of parallel arm resonators, and the plurality of inductors are provided on a pattern layer of the filter chip.

18. The filter device according to claim 17, wherein the pattern layer includes a conductive portion and an insulating portion.

19. The filter device according to claim 17, wherein the pattern layer includes a plurality of laminated layers.

20. The filter device according to claim 1, wherein the filter chip includes $LiTaO_3$.

* * * * *